United States Patent
Herring et al.

(12)

(10) Patent No.: US 6,477,050 B1
(45) Date of Patent: Nov. 5, 2002

(54) TILT-AWAY PROCESSOR RETENTION MODULE WITH HOLD-DOWN SCREW DEVICE

(75) Inventors: Dean Frederick Herring, Youngsville, NC (US); Beth Frayne Loebach, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/952,330

(22) Filed: Sep. 14, 2001

(51) Int. Cl.$^7$ ................................................ H05K 7/20
(52) U.S. Cl. .................. 361/704; 24/458; 165/80.3; 165/185; 248/510; 257/719; 257/729; 361/710; 361/719
(58) Field of Search .................... 24/457–458; 165/80.2, 165/80.3, 185; 174/16.3; 248/505, 510; 257/706–707, 712–713, 722, 718–719, 726–727; 361/688, 690, 704–707, 709–710, 715, 719–721, 802, 809, 829–831

(56) References Cited

U.S. PATENT DOCUMENTS

| | | | |
|---|---|---|---|
| 5,493,475 A | * | 2/1996 | Lin ............................ 361/710 |
| 5,771,153 A | | 6/1998 | Sheng |
| 5,903,434 A | | 5/1999 | Chiou |
| 6,078,500 A | * | 6/2000 | Beaman et al. ............. 361/704 |
| 6,082,440 A | | 7/2000 | Clemens et al. |
| 6,104,614 A | | 8/2000 | Chou et al. |
| 6,130,821 A | | 10/2000 | Gerber |
| 6,205,026 B1 | * | 3/2001 | Wong et al. ................ 361/704 |
| 6,344,971 B1 | * | 2/2002 | Ju .............................. 361/704 |

* cited by examiner

Primary Examiner—Gregory Thompson
(74) Attorney, Agent, or Firm—Bracewell & Patterson, L.L.P.

(57) ABSTRACT

A fastening mechanism for installing a processor heatsink on a planar board space takes up a minimal amount of the planar board space. The heatsink is held down securely against the top of the processor with a substantial amount of force. This is accomplished through a screw and leaf spring mechanism at each side edge of the processor. The screw and leaf spring arrangement are rotated out of the way while the heatsink is installed and then returned to their original positions to retain the heatsink. The mechanism is partially assembled prior to the installation of the heatsink.

14 Claims, 5 Drawing Sheets

TILT-AWAY PROCESSOR RETENTION MODULE WITH HOLD-DOWN SCREW DEVICE

BACKGROUND OF THE INVENTION

1. Technical Field

The present invention relates in general to an improved device for retaining computer processors, and in particular to an improved method and apparatus having a tilt-away processor retention module with .a hold-down screw device.

2. Description of the Prior Art

In computer equipment, the need to upgrade and/or replace electrical components is more prevalent than ever. Many different solutions for installing new components or removing existing components are known in the prior art. However, not all devices or methods allow technicians to perform the work efficiently and reliably. This is particularly true for components that require fasteners such as screws for mounting purposes, or those that require latching or retention mechanisms for enhanced retention capability. Moreover, some new components are not compatible with the existing retention mechanisms that were used with the previous components that they are replacing.

This problem is exacerbated by the enhanced cooling needs of today's high speed computer processors. Processor manufacturers now require computer manufacturing companies to accommodate lower junction temperatures while allowing for greater power dissipation. These requirements demand enhanced thermal design solutions. To maintain adequate heat sink efficiencies, some cooling systems need to incorporate aggressive "passive" and/or "active" cooling solutions. Passive heat sinks allow airflow generated external to the heat sink to pass over the heat sink to permit redundant cooling. Some computer systems that do not require cooling redundancy may require more active heat sink cooling. These advanced thermal design solutions are very difficult if not impossible to incorporate into current retention mechanism designs. Thus, a need exists for an improved system for reliably installing and removing an electrical component, such as a processor, with a retention mechanism that is capable of incorporating a cooling system such as a heatsink.

SUMMARY OF THE INVENTION

One embodiment of the present invention is a fastening mechanism that allows for the installation of a processor heatsink while taking up a minimal amount of planar board space. The heatsink must be held down securely against the top of the processor with a substantial amount of force. This is accomplished through a screw and leaf spring mechanism at each side edge of the processor. The invention rotates the screw and leaf spring arrangement out of the way while the heatsink is installed and then returned to their original positions to retain the heatsink. The disclosed invention has the advantage of being partially assembled prior to the installation of the heatsink.

The foregoing and other objects and advantages of the present invention will be apparent to those skilled in the art, in view of the following detailed description of the preferred embodiment of the present invention, taken in conjunction with the appended claims and the accompanying drawings.

BRIEF DESCRIPTION OF THE DRAWINGS

So that the manner in which the features, advantages and objects of the invention, as well as others which will become apparent, are attained and can be understood in more detail, more particular description of the invention briefly summarized above may be had by reference to the embodiment thereof which is illustrated in the appended drawings, which drawings form a part of this specification. It is to be noted, however, that the drawings illustrate only a preferred embodiment of the invention and is therefore not to be considered limiting of its scope as the invention may admit to other equally effective embodiments.

DETAILED DESCRIPTION OF THE PREFERRED EMBODIMENT OF THE PRESENT INVENTION

Figure 1:
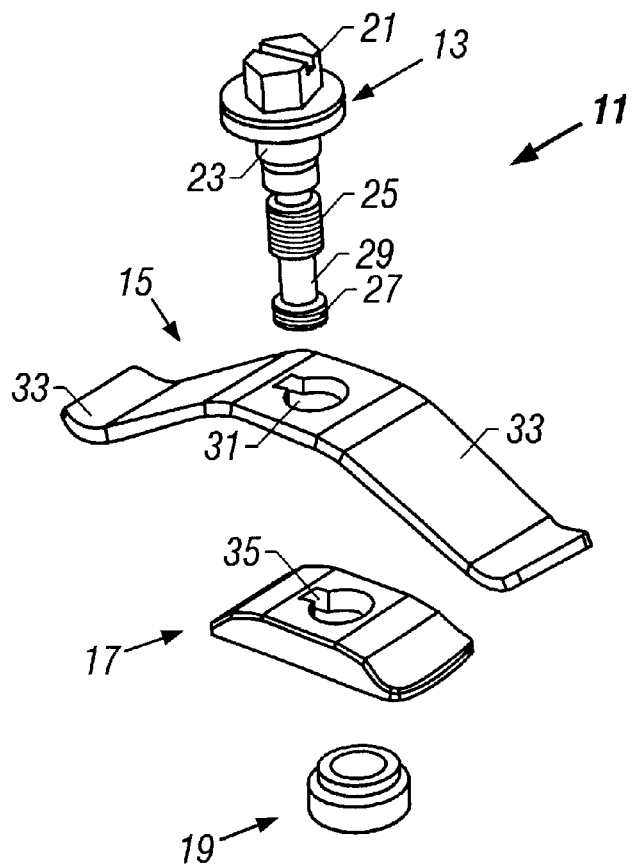
FIG. 1 is an exploded isometric view of one embodiment of a retention module hold down screw device constructed in accordance with the present invention.
Figure 2:
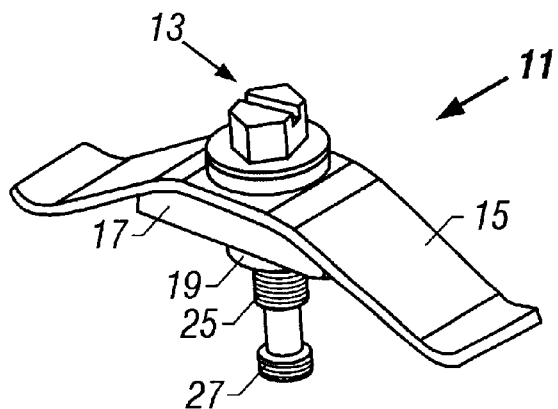
FIG. 2 is an isometric view of the retention module hold down screw device of FIG. 1 in an assembled form (hereinafter, the hold down screw assembly-retention assembly).

Referring to FIGS. 1 and 2, one embodiment of a retainer or retention assembly 11 is shown. Retainer or retention assembly 11 comprises a screw 13, a leaf spring 15, a support member 17, and a collar 19. Screw 13 has a slotted head 21 and a shank 23 with two threaded portions 25, 27 that are axially spaced apart by an undercut 29. Leaf spring 15 is formed from a metallic spring-like material and has a central hole 31 that is flanked by a pair wings 33. Wings 33 are formed at an acute angle relative to the plane defined by hole 31 and are upturned at their distal ends. Support member 17 has a flat lower surface, an upper surface that is contoured to the lower surface of leaf spring 15, and a central hole 35.

Prior to operation, retention assembly 11 is pre-assembled as shown in FIG. 2.

Screw 13 extends through the central hole each of the elements leaf spring 15, support member 17, and collar 19, such that both threaded portions 25, 27 are exposed beneath collar 19. In this configuration, the upper planar surface of leaf spring 15 abuts the lower surface of head 21 on screw 13, the upper surface of support member 17 abuts the lower surface of leaf spring 15, and collar 19 is secured against a shoulder on shank 23 to form a retention assembly 11 in which leaf spring 15 and support member 17 are free to rotate about shank 23.

Figure 3:
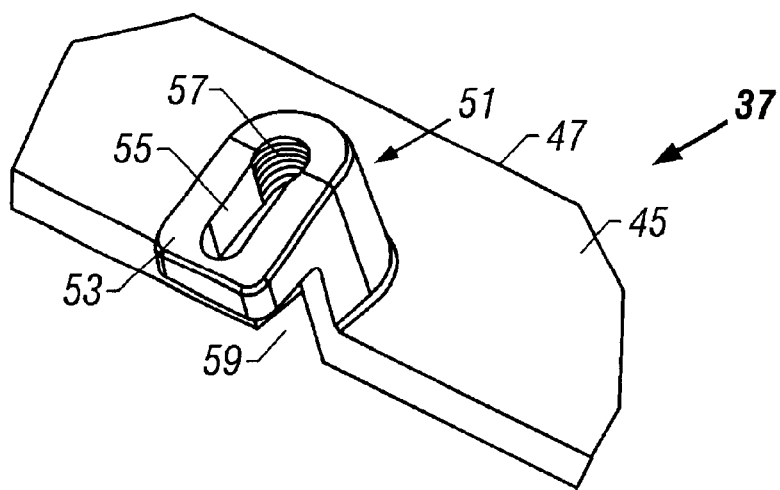
FIG. 3 is a partial isometric view of a retention module bracket utilized by the retention module of FIG. 1.
Figure 4:
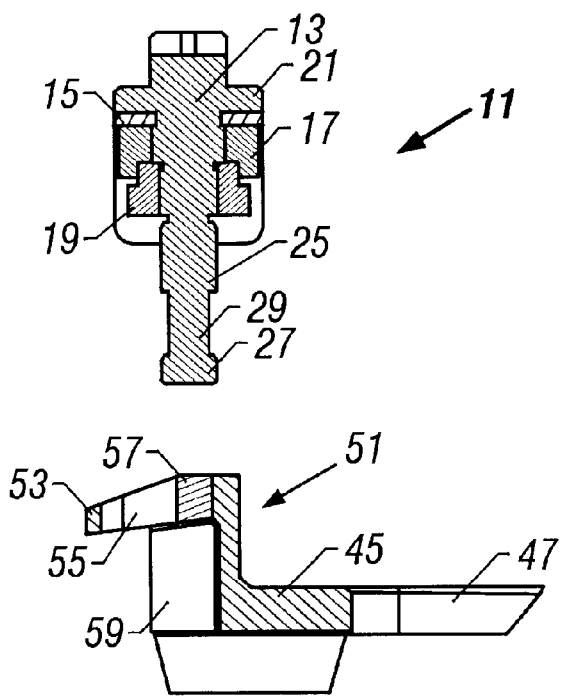
FIG. 4 is a sectional side view of the retention module hold down screw device of FIG. 1 and the retention module bracket of FIG. 3 (hereinafter, the retention module assembly) prior to engagement.
Figure 6:
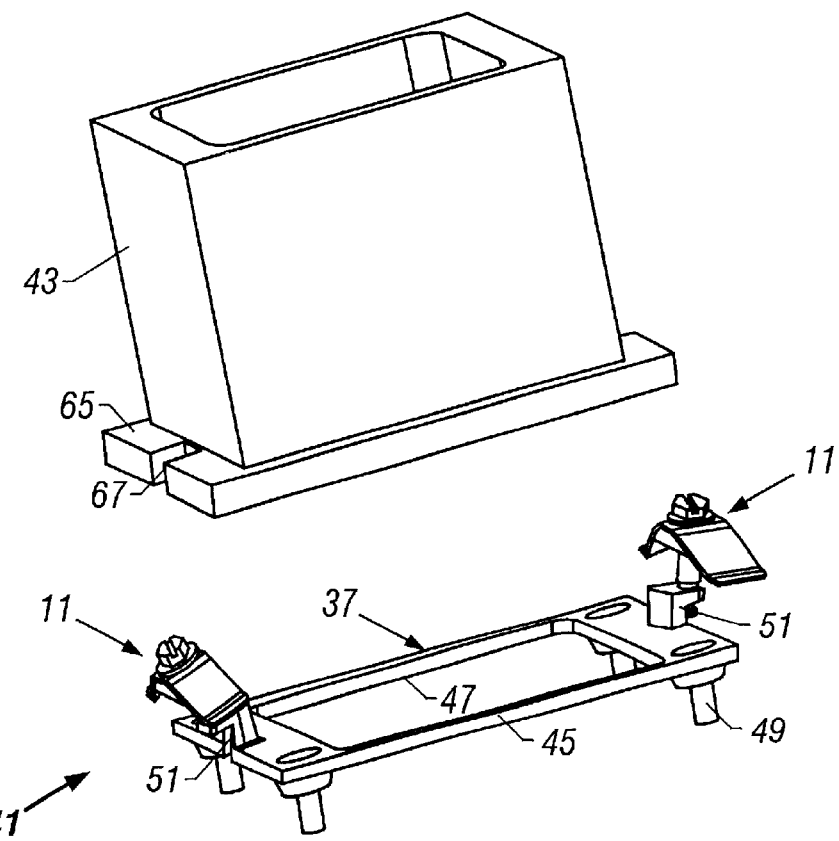
FIG. 6 is an isometric view of the retention module assembly after engagement but prior to attachment of a heatsink.

Referring now to FIG. 6, a pair of retention assemblies 11 are used in conjunction with a base or bracket 37 to form an overall retention module 41. As will be discussed in greater detail below, retention module 41 is used to releasably attach a heat sink 43 or other cooling device to a computer processor (not shown). Bracket 37 comprises a generally rectangular body 45 with a central aperture 47 and a plurality of alignment pins 49. As best shown in FIG. 3, retention module bracket 37 is provided with a pair of mounting bosses 51 that are located on opposite sides of bracket 37. Each boss 51 protrudes above an upper surface of body 45 and has an inverted, generally L-shaped side profile (see FIG. 4). Boss 51 has a flat, slender protrusion 53 that extends away from bracket 37 at a slightly tapered or downward turned angle to form a ramp. An elongated oval-like aperture 55 extends through boss 51 and protrusion 53 and has threads 57 in boss 51. Aperture 55 also slightly tapers down in width from threads 57 to the distal end of aperture 55 in protrusion 53. A larger, generally rectangular opening 59 is located below aperture 55 in boss 51 and body 45.

Figure 5:
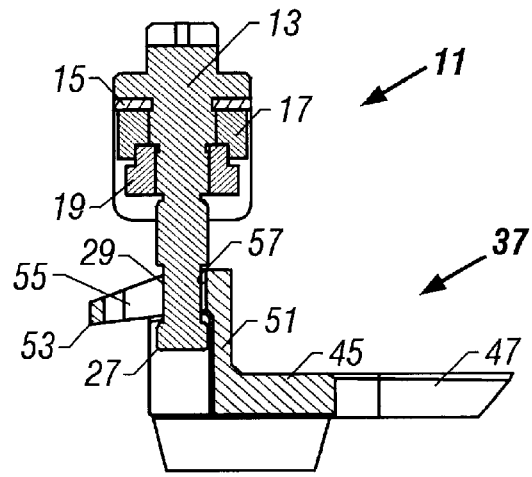
FIG. 5 is a sectional side view of the retention module assembly after engagement.
Figure 7:
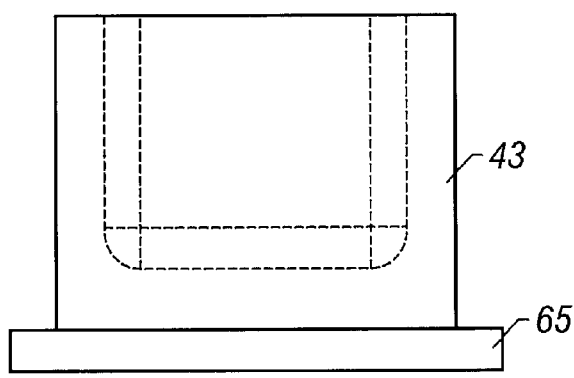
FIG.7 is a side view of the retention module assembly after engagement but prior to attachment of the heatsink.
Figure 7:
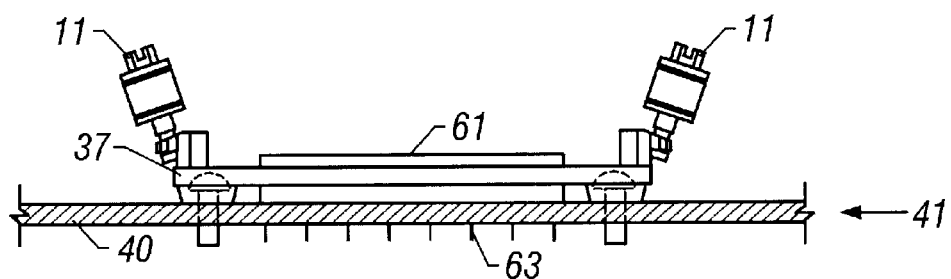
Figure 9:
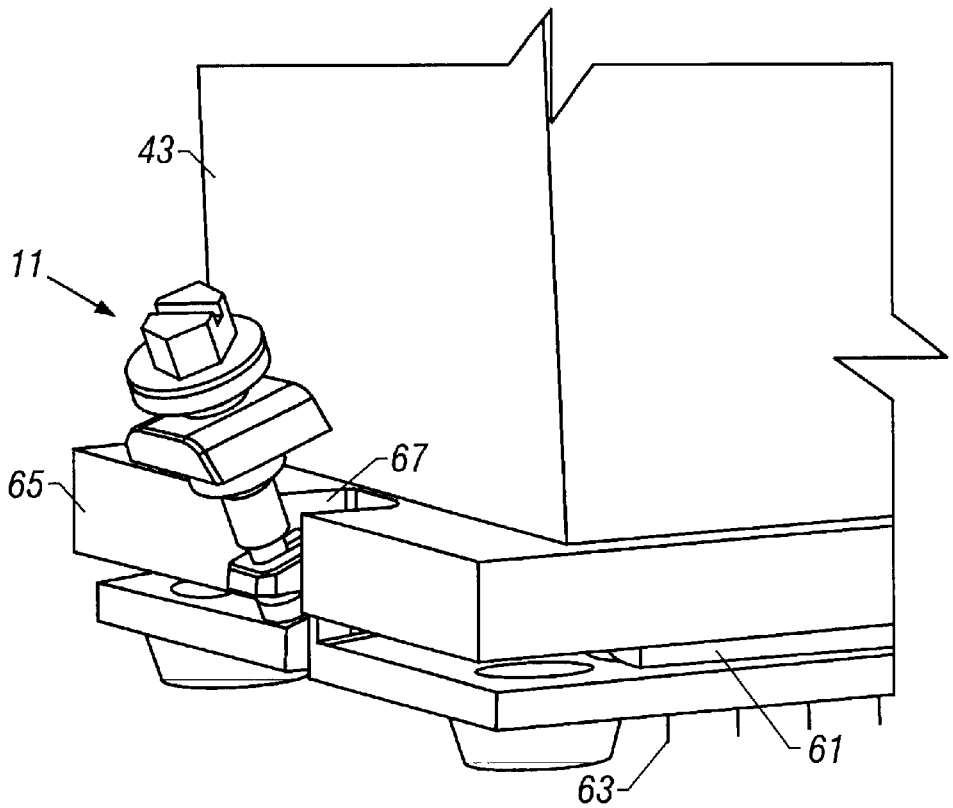
FIG. 9 is an enlarged isometric view of the retention module assembly and the heatsink with one of the retention modules hold down screw assembly tilted away.
Figure 10:
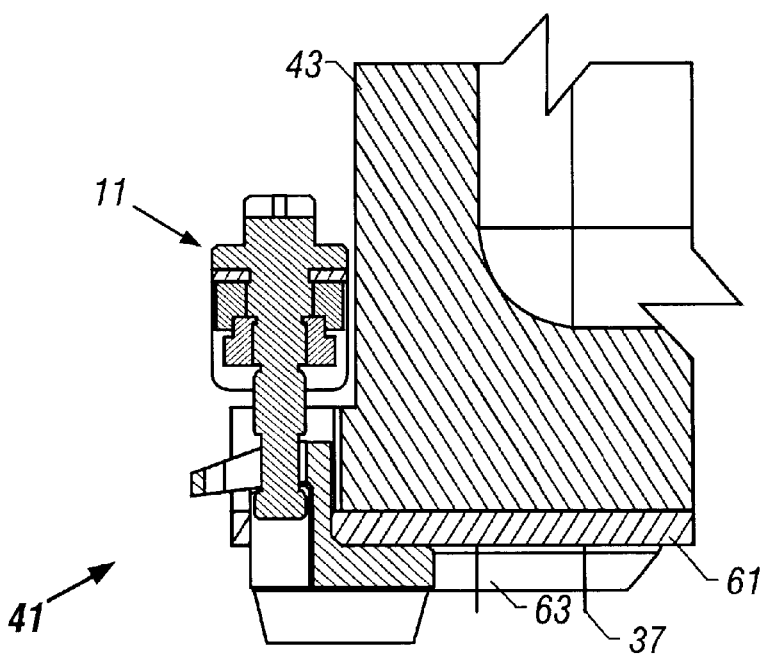
FIG. 10 is a partial sectional side view of one of the retention module assemblies and the heatsink.

The entire retention module 41 is preferably pre-assembled as shown in FIG. 6 by mounting both of the retention assemblies 11 to the single bracket 37 prior to joining heatsink 43 to the processor. Each retention assembly 11 is releasably joined to bracket 37 by first driving threaded portion 27 of screw 13 through threads 57 in aperture 55 such that undercut 29 is located in aperture 55 (FIG. 5). When retention assembly 11 is in this position, it is securely retained in boss 51 on bracket 37, but is readily pivotable relative thereto in aperture 55 between an upright position (FIGS. 5 and 10), and a tilt-away or pivoted position (FIGS. 6, 7, and 9).

Figure 8:
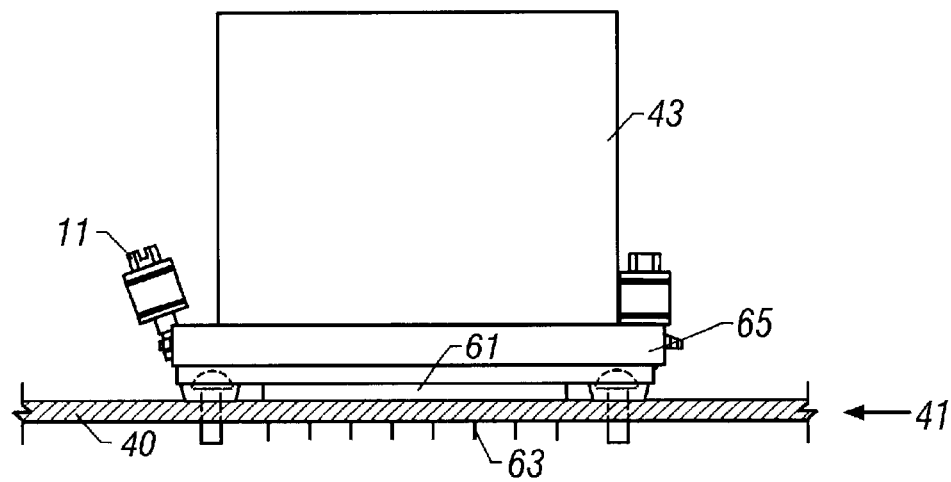
FIG. 8 is a side view of the retention module assembly after engagement and after attachment of the heatsink.

In operation (FIG. 7), retention assemblies 11 are initially in their pivoted positions with wings 33 oriented as shown before heatsink 43 is mounted to retention module 41. Retention module 41 is preferably pre-mounted to a planar support surface, such as a printed circuit board 40. Next, the computer processor 61, is placed on top of planar 40 within the opening 47 in bracket 37 such that its processor pins 63 protrude downward through opening 47 in bracket 37. Heatsink 43 is then lowered into place on top of processor 61 (FIG. 8), again with the retention assemblies still in their pivoted positions. Heatsink 43 is provided with recesses 67 for accommodating bosses 51.

One of the retention assemblies 11 is returned to its upright position (see right side of FIG. 8) such that wings 33 of leaf spring 15 are located above flanges 65 on one side of heatsink 43. Thus, flanges 65 are trapped between wings 33 and the upper surface of body 45 on bracket 37. The screw 13 of right side retention assembly 11 is driven down further into boss 51 (with a screwdriver, for example) such that its threaded portion 25 engages threads 57 in aperture 55. As screw 13 rotates into boss 15, wings 33 of leaf spring 15 press down against flanges 65 to securely retain one side of heatsink 43 on bracket 37. As assembly 11 turns, wings 33 do not turn with it. This is the secured position for retention assembly 11. Finally, the other retention assembly 11 (FIG. 9 and left side of FIG. 8) is pivoted to its upright position (FIG. 10) and then threaded down into its boss 51 as previously described for the other retention assembly 11 to completely secure heatsink 43 and processor 61 on retention module 41. In summary, retention assemblies 11 secure heatsink 43 and processor 61 to bracket 37 in their secured positions, loosely restrain heatsink 43 and processor 61 in their upright positions, and release heatsink 43 and processor 61 in their pivoted positions. Heatsink 43 and/or processor 61 may be readily removed and/or replaced by reversing these steps.

The present invention has several advantages. The invention solves the problem of having the mounting hardware for a processor heatsink be part of the retention module on the planar assembly and not the heatsink. This enables the heatsink to be more generic in geometry and stocked to allow the heatsink to be used in other locations and at a lower cost. The invention also allows for the total assembly of the heatsink hold down screw device features to be part of the retention module, thereby eliminating unnecessary assemblyby end level manufacturing. This design also allows technicians to easily install, remove, replace, and/or upgrade cooling and processor components with ease. The module is compatible with both existing cartridges and retention mechanisms, as well as with newer designs. Finally, this efficient, reliable design requires no additional fasteners.

While the invention has been shown or described in only some of its forms, it should be apparent to those skilled in the art that it is not so limited, but is susceptible to various changes without departing from the scope of the invention.

What is claimed is:

1. A retention module for securing a processor and a cooling device, comprising:
   a base;
   a plurality of retainers mounted to the base, each of the retainers having a pivoted position, an upright position, and a secured position, wherein the retainers are threadingly engaged to the base; and wherein
   the retainers are adapted to secure the processor and the cooling device to the base in their secured positions, loosely restrain the processor and the cooling device to the base in their upright positions, and release the processor and the cooling device from the base in their pivoted positions.

2. The retention module of claim 1 wherein the base comprises a body with an aperture and a plurality of bosses for engaging individual ones of the retainers.

3. The retention module of claim 1 wherein each of the retainers comprises a screw, a leaf spring, a support member, and a collar.

4. The retention module of claim 1 wherein each of the retainers has two threaded portions that are axially spaced apart by an undercut.

5. A retention module, comprising:
   a processor;
   a cooling device mounted to the processor for cooling the processor;
   a bracket having a body for supporting the processor with an opening for accommodating pins on the processor, and a pair of bosses extending from the body, each of the bosses having a protrusion and an aperture;
   a retainer pivotally mounted to each of the bosses in the apertures, each of the retainers having a pivoted position located in the protrusion, an upright position, and a secured position; and wherein
   the retainers secure the processor and the cooling device to the bracket in their secured positions, loosely restrain the processor and the cooling device to the bracket in their upright positions, and release the processor and the cooling device from the bracket in their pivoted positions.

6. The retention module of claim 5 wherein each of the retainers has two threaded portions that are axially spaced apart by an undercut.

7. The retention module of claim 5 wherein each of the retainers comprises a screw, a leaf spring, a support member, and a collar.

8. The retention module of claim 5 wherein each of the protrusions taper down away from their respective bosses, and wherein the aperture is threaded on one end and tapers in width from the boss to the protrusion.

9. The retention module of claim 5 wherein each of the retainers captures the heatsink on its respective boss between a leaf spring and a surface of the body of the bracket.

10. The retention module of claim 5 wherein the retainers are threadingly engaged to the bosses in the secured positions and otherwise loosely retained on the bosses.

11. A method of secured a processor and a cooling device, comprising;
  (a) providing a retention module on a planar surface, the retention module having a base, and a plurality of retainers mounted to the base;
  (b) locating each of the retainers in a pivoted position;
  (c) placing a processor on the base and a cooling device on the processor;
  (d) pivoting the retainers to an upright position such that the processor and the cooling device are loosely restrained;
  (e) moving the retainers to a secured position to secure the processor and the cooling device to the base; and wherein step (e) comprises:
  screwing the retainers into the base to move the retainers from the upright position to the secured position.

12. The method of claim 11 wherein step (b) comprises pivoting the retainers in individual apertures in the base.

13. The method of claim 11 wherein step (a) comprises providing each of the retainers with a screw, a leaf spring, a support member, and a collar.

14. The method of claim 11 wherein step (a) comprises providing each of the retainers with two threaded portions that are axially spaced apart by an undercut.

* * * * *